(12) United States Patent
Kraemmer

(10) Patent No.: US 7,064,315 B2
(45) Date of Patent: Jun. 20, 2006

(54) METHOD AND DEVICE FOR COMPENSATING FOR INTERFERING VARIABLES IN AN OPTICAL SENSOR

(75) Inventor: Peter Kraemmer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 198 days.

(21) Appl. No.: 10/222,786

(22) Filed: Aug. 19, 2002

(65) Prior Publication Data
US 2003/0034768 A1 Feb. 20, 2003

(30) Foreign Application Priority Data
Aug. 17, 2001 (DE) .................. 101 40 482

(51) Int. Cl.
*G01J 5/08* (2006.01)
*G01D 5/36* (2006.01)
*G02B 6/00* (2006.01)

(52) U.S. Cl. .................... 250/227.18; 250/227.14; 250/237 G; 385/12

(58) Field of Classification Search .......... 250/237 G, 250/231.19, 214 C, 227.14, 227.18, 231.1; 385/12, 13, 37; 359/566; 73/108
See application file for complete search history.

(56) References Cited

U.S. PATENT DOCUMENTS

| | | | |
|---|---|---|---|
| 4,002,975 A | 1/1977 | Erickson et al. | 324/96 |
| 4,269,483 A | 5/1981 | Feldtkeller | 359/252 |
| 5,042,898 A * | 8/1991 | Morey et al. | 385/37 |
| 5,394,488 A * | 2/1995 | Fernald et al. | 385/13 |
| 5,764,046 A | 6/1998 | Bosselmann | |
| 5,811,964 A | 9/1998 | Bosselmann et al. | 324/96 |
| 6,016,702 A * | 1/2000 | Maron | 73/705 |
| 6,181,851 B1 | 1/2001 | Pan et al. | |
| 6,477,309 B1 * | 11/2002 | So | 385/137 |
| 6,740,866 B1 * | 5/2004 | Bohnert et al. | 250/227.14 |

FOREIGN PATENT DOCUMENTS

| | | |
|---|---|---|
| DE | 199 38 978 A1 | 2/2001 |
| EP | 0390581 A2 | 10/1990 |
| EP | 0786092 B1 | 4/1999 |
| EP | 1 014 123 A2 | 6/2000 |
| GB | 1353543 | 5/1974 |
| WO | WO 95/10046 | 4/1995 |

(Continued)

OTHER PUBLICATIONS

Mitsui, et al., "Development of Fiber-Optic Voltage Sensors and Magnetic-Field Sensors", IEEE Transactions on Power Delivery, vol. PWRD-2, No. 1, Jan. 1987, pp. 87-93.

(Continued)

*Primary Examiner*—Thanh X. Luu
*Assistant Examiner*—Stephen Yam
(74) *Attorney, Agent, or Firm*—Staas & Halsey LLP

(57) ABSTRACT

The method and the device are used for compensating for interfering variables in an optical sensor (50), which is at least sensitive with respect to a measured variable (M), a wavelength ($\lambda$) of the optical signal (S1) fed in and an interfering variable (T). The optical signal (S1) also passes through a compensation element (40) which, together with the optical sensor (50), is located in a common interfering variable effect range (60) with the same effect of the interfering variable (T). In the compensation element (40), the interfering variable (T) changes the wavelength of the optical signal (S1) in such a way that the partial influences that take place in the optical sensor (50) on account of the changed wavelength and on account of the interfering variable (T) cancel one another out.

14 Claims, 2 Drawing Sheets

FOREIGN PATENT DOCUMENTS

| | | |
|---|---|---|
| WO | WO95/10046 | 4/1995 |
| WO | WO96/12195 | 4/1996 |
| WO | WO 98/27446 | 6/1998 |

OTHER PUBLICATIONS

Rose et al., "Verdet Constant Dispersion in Annealed Optical Fiber Current Sensors", Journal of Lightwave Technology, vol. 15, No. 5, May 1997, pp. 803-807.

Liu et al., "Enhanced Pressure and Temperature Sensitivity of a Fiber Bragg Grating with Polymer Packaging", SPIE-Int. Soc. Opt. Eng, 1999, vol. 3740, Abstract.

Liu et al., "Enhanced Pressure and Temperature Sensitivity of a Fiber Bragg Grating with Polymer Packaging", SPIE-Int. Soc. Opt. Eng, 1999, vol. 3740, pp. 284-287.

* cited by examiner

METHOD AND DEVICE FOR COMPENSATING FOR INTERFERING VARIABLES IN AN OPTICAL SENSOR

CROSS REFERENCE TO RELATED APPLICATIONS

This application is based on and hereby claims priority to German Application No. 101 40 482.4 filed on Aug. 17, 2001, the contents of which are hereby incorporated by reference.

BACKGROUND OF THE INVENTION

One aspect of the invention relates to a method for compensating for interfering variables in an optical sensor, in which an optical signal in the optical sensor is influenced at least as a function of a measured variable to be detected, a wavelength of the optical signal fed in and an interfering variable. In addition, one aspect of the invention relates to a device for compensating for the interfering variables in an optical sensor, the optical sensor through which an optical signal passes being at least sensitive with respect to a measured variable, a wavelength of the optical signal and an interfering variable.

Such a method and such a device are known, for example from U.S. Pat. No. 5,764,046 or WO 95/10046 A1. In these known methods and devices, a measured value for a magnetic field strength or an electric field strength is determined by an optical sensor designed as a Faraday or Pockels sensor. By a suitable sensor arrangement and evaluation, an electric current can also be detected by a Faraday sensor, and an electric voltage can be detected by a Pockels sensor. Both the Faraday effect and the Pockels effect are based on influencing, as a function of the measured variable, the state of polarization of the input optical signal fed into the optical sensor.

In both sensor types, the measuring sensitivity depends on the wavelength of the optical signal fed into the respective optical sensor. This wavelength dependence is also used, inter alia, to adjust the sensor sensitivity.

However, a change in the state of polarization is caused not only by the measured variables to be detected (for example magnetic or electric field) but also by certain environmental conditions, such as the ambient temperature or mechanical vibration of the optical sensor. In order to compensate for these undesired interfering variable influences, methods are described in U.S. Pat. No. 5,764,046 and WO 95/10046 A1 which substantially use suitable evaluation of the output optical signal received in the receiver.

In the case of this compensation method, the influence of the interfering variable is only extracted in retrospect within the context of signal evaluation. Here, it is entirely possible that no complete division can be achieved between the measured-variable-dependent and interfering-variable-dependent component in the output optical signal. As a result, errors occur in these compensation methods, and the measured variable may be determined only inaccurately.

In order to avoid the problem of the separation between measured and interfering variables, which is no longer possible in retrospect, a temperature compensation method for a Pockels sensor is described in the technical article by T. Mitsui et al. "Development of Fiber-Optic Voltage Sensors and Magnetic-Field Sensors" in IEEE Transactions on Power Delivery, vol. PWRD-2, No. 1, 1987, pages 87 to 93, in which method the compensation of the interfering temperature influence is carried out directly in the Pockels sensor itself. For this purpose, a specific construction is used for the Pockels sensor, in which the temperature dependence of the Pockels effect used for the measured variable detection is to the greatest extent just mutually cancelled by the temperature dependence of the optical activity. This means that the measured-variable-dependent influencing of the input optical signal taking place in the Pockels sensor described is to a large extent influenced independently of the interfering variable comprising ambient temperature. Retrospective separation in the measured-variable-dependent and interfering-variable-dependent component in the output optical signal is therefore not required. The particularly advantageous compensation method described in the technical article is, however, possible only for the specific application, that is to say given precisely this material selection and given precisely these geometric dimensions of the Pockels sensor. It is a specific solution and cannot be transferred to other optical sensors.

A potential object of the invention is, therefore, to specify a method and a device of the type designated at the beginning such that the best possible interfering variable compensation is possible, in particular also for different types of optical sensors.

SUMMARY OF THE INVENTION

The method according to one aspect of the invention is a method of the type designated at the beginning, which is characterized in that the optical signal is also fed into a compensation element which, together with the optical sensor, is located in a common interfering variable effect region with largely equal effect of the interfering variable on the optical sensor and on the compensation element, and during the passage through the compensation element under the influence of the interfering variable, its wavelength is changed in such a way that the partial influences which are exerted in the optical sensor on account of the changed wavelength and on account of the interfering variable at least largely cancel one another out.

In the device according to one aspect of the invention for compensating interfering variables in an optical sensor, the device is of the type designated at the beginning, which is characterized by a compensation element, through which the optical signal likewise passes and, together with the optical sensor, is located in a common interfering variable effect region with largely the same effect of the interfering variable on the optical sensor and the compensation element, the compensation element being configured in such a way that a wavelength change brought about during the passage of the optical signal through the compensation element under the influence of the interfering variable leads to a wavelength-dependent partial influence during the subsequent passage of the optical signal, changed in its wavelength, through the optical sensor, which at least largely compensates for an interfering-variable-dependent partial influence in the optical sensor.

The concept is based on the finding that many different types of optical sensors, in addition to the desired measured variable sensitivity, also exhibit a dependence on at least one interfering variable and, moreover, also on the wavelength of the optical signal fed in. In the known methods and devices for optical measured variable acquisition, the last-named dependence normally does not play any part, since the wavelength is selected once during the generation of the input optical signal and then normally no longer changes. On the other hand, the behavior with the interfering variable influence is different, which most certainly hampers the acquisition of the measured variable in the optical sensor.

In has, then, been recognized that the wavelength dependence of the optical sensor may be used specifically to compensate for the interfering variable dependence. For this purpose, in a separate compensation element, a wavelength change is caused deliberately. This wavelength change is precisely of such a size that the partial influence established in the optical sensor on account of this wavelength change just mutually cancels the partial influence of the input optical signal caused by the interfering variable.

It is particularly beneficial if the wavelength change in the compensation element is caused automatically by the same interfering variable whose influence is to be compensated for in the optical sensor. For this purpose, the compensation element is configured in an appropriate manner. This is done, for example, with the aid of previously determined measured values or previously performed calculations for the dependence of the optical sensor both on the wavelength and on the interfering variable to be compensated for. It is then possible for a quasi-inverse relationship between the wavelength and the interfering variable to be determined, which is required for the mutual compensation of the wavelength dependent and the interfering-variable-dependent partial influences in the optical sensor. The relationship determined in this way between wavelength or wavelength change and the interfering variable is then used for the specific configuration of the compensation element. The compensation element is therefore modeled in accordance with this relationship.

With this compensation method, the optical signal in the optical sensor is largely influenced only by the measured variable to be registered. This means that a more accurate registration of the measured variable is obtained than in the case of only retrospective elimination of the interfering-variable-induced influence in the evaluation unit. In addition, the compensation method can also be used for different types of optical sensors. In particular, it is not restricted to a specific material or a specific sensor geometry. The method can, for example, be applied to a Pockels sensor or else to a Faraday sensor. In this case, the Faraday sensor can be designed as a transmission or reflection sensor and also as a glass ring or fiber-optic sensor. In addition, use in the case of other optical sensor types is of course possible.

An embodiment in which the compensation element is designed in the form of a Bragg grating is beneficial. Off an optical signal that is incident on such a Bragg grating, a specific wavelength or else a specific wavelength component is reflected. Which wavelength or which wavelength component is reflected from the Bragg grating depends on the grating period of the Bragg grating and the refractive index of the light-carrying medium. If this grating period or this refractive index is changed under the influence of the interfering variable, an interfering-variable-dependent change in the wavelength component in the reflected signal consequently also occurs. In accordance with the explanations above, it is precisely this method which is needed for the compensation element.

There are preferred embodiments in which the interfering variable to be compensated is present in the form of a temperature, for example an ambient temperature, or else in the form of a mechanical vibration to which the optical sensor is subjected. If the compensation element is subjected virtually to the same interfering variable influence, that is to say for example the same ambient temperature or the same mechanical vibration, as that of the optical sensor, particularly good interfering variable compensation of the optical sensor is achieved.

In a further preferred variant, the modeling of the compensation element mentioned above is brought about in accordance with a desired, previously determined relationship between the wavelength change and the interfering variable, with the aid of a housing. By a specific configuration, for example shaping, of the housing, it is possible to achieve the situation where the wavelength changes in accordance with the desired predetermined manner under the influence of the interfering variable in the compensation element. This desired predetermined manner results from the previously determined interfering-variable and wavelength dependence of the optical sensor.

Alternatively or else additionally to the housing, the compensation element can have a coating which also brings about the desired wavelength influence through the interfering variable.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
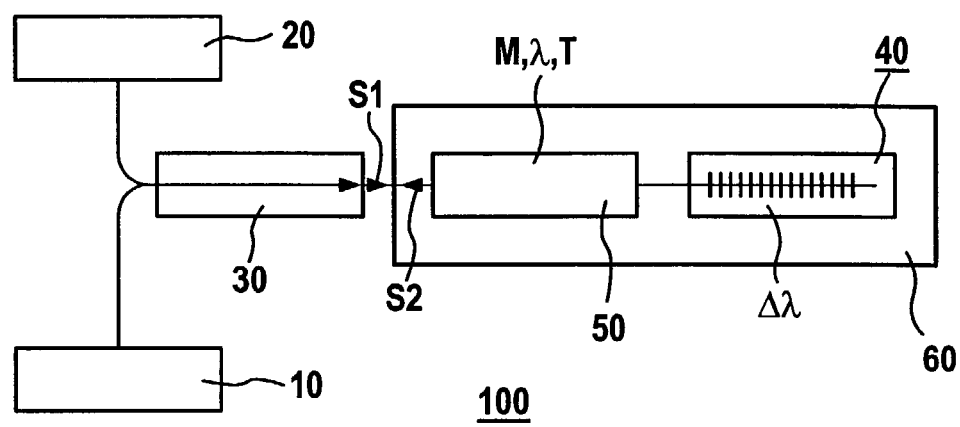
FIGS. 1 and 2 in each case show a device arrangement for interfering-variable compensated optical measured value acquisition by a compensation element

Reference will now be made in detail to the preferred embodiments of the present invention, examples of which are illustrated in the accompanying drawings, wherein like reference numerals refer to like elements throughout.

In FIGS. 1 to 4, mutually corresponding parts are provided with the same designations.

FIG. 1 illustrates a device 100 for interfering-variable compensated optical measured value acquisition. The device 100 comprises an optical sensor 50, which is intended to acquire a measured variable M. To operate the sensor 50, an input optical signal S1 produced by a light source 10 is fed to the sensor 50 via a coupling element 30. The input optical signal S1 passes through the sensor 50 and in so doing experiences a change dependent on the measured variable. In addition to the desired measured-variable sensitivity, however, the sensor 50 also exhibits an undesired sensitivity with respect to an interfering variable, in the present case with respect to the ambient temperature T. Therefore, as it passes through the sensor 50, the input optical signal S1 is influenced not only by the measured variable M but also by the temperature T.

In order to compensate for this undesired interfering variable influence in the sensor 50, a compensation element 40 is connected downstream of the sensor 50, in which the input optical signal S1 is reflected, so that it passes through the sensor 50 again. The compensatory effect is based on a wavelength dependence of the measured-variable sensitivity which is additionally present in the optical sensor 50. The influence in the optical sensor 50 therefore also takes place as a function of a wavelength λ of the optical signal passing through the sensor 50. The wavelength λ is changed by the compensation element 40 in such a way that the interfering-variable-dependent partial influence and the wavelength dependent partial influence in the optical sensor 50 cancel one another out virtually completely.

The compensation element 40 is therefore configured precisely in such a way that it causes a change Δλ in the reflected wavelength content which is dependent on the ambient temperature T, present as an interfering variable in this exemplary embodiment. The wavelength change Δλ effected by the compensation element 40 is just sufficiently large that the above-described compensation effect of the two partial influences in the optical sensor 50 occurs.

The compensation element 40 is designed as a fiber Bragg grating, whose wavelength-influencing behavior is matched precisely to the requirements on the sensor 50 in this regard. In order to achieve the best possible compensation, first of all measured values for the wavelength dependent influence and also for the interfering-variable-dependent partial influence are determined for the optical sensor 50 used in the respective application. From this, a relationship between the wavelength λ and the interfering variable T may be determined, from which it is possible to gather, for each value of the interfering variable T, the manner in which the wavelength λ must be changed in order to achieve the most complete compensation in the optical sensor 50. The compensation element 40 is then configured precisely in accordance with this determined relationship.

In the case of a compensation element 40 configured as a fiber Bragg grating, wavelength reflection of the optical signal radiated in takes place, determined by the Bragg grating period and the refractive index of the light-carrying medium. By appropriate measures, the wavelength λ of the optical component reflected at the fiber Bragg grating can be made to depend in the desired manner on the ambient temperature T present here as interfering variable. If then both the optical sensor 50 and the compensation element 40 are located in a common interfering variable effect region 60, the optical sensor 50 exhibits particularly good compensation of the interfering influence of the ambient temperature T. In the common interfering variable effect region which, in the exemplary embodiment of FIG. 1, is designed as an isothermal range, the sensor 50 and the compensation element 40 are subject to the same fluctuations in the ambient temperature T.

Of the broadband input optical signal S1, a component is reflected, in the compensation element 40, whose wavelength λ or whose main wavelength has been changed in the manner established previously as a function of the ambient temperature T. This reflected component passes through the sensor 50 again and, during the passage, is substantially still only influenced by the measured variable M to be detected, because of the interfering variable compensation. As an output signal S2, this optical signal carrying the information about the measured variable M leaves the sensor 50 and is fed to a receiver 20 via the coupling element 30. In said receiver 20, evaluation and calculation of the measured value for the measured variable M are carried out.

The compensation method described is not restricted to a specific type of optical sensor 50. It is suitable, for example, for an optical sensor 50 designed as a Pockels sensor or one designed as a Faraday sensor. Likewise, the field of application is not restricted to the ambient temperature T as the single interfering variable to be compensated for.

Figure 2:
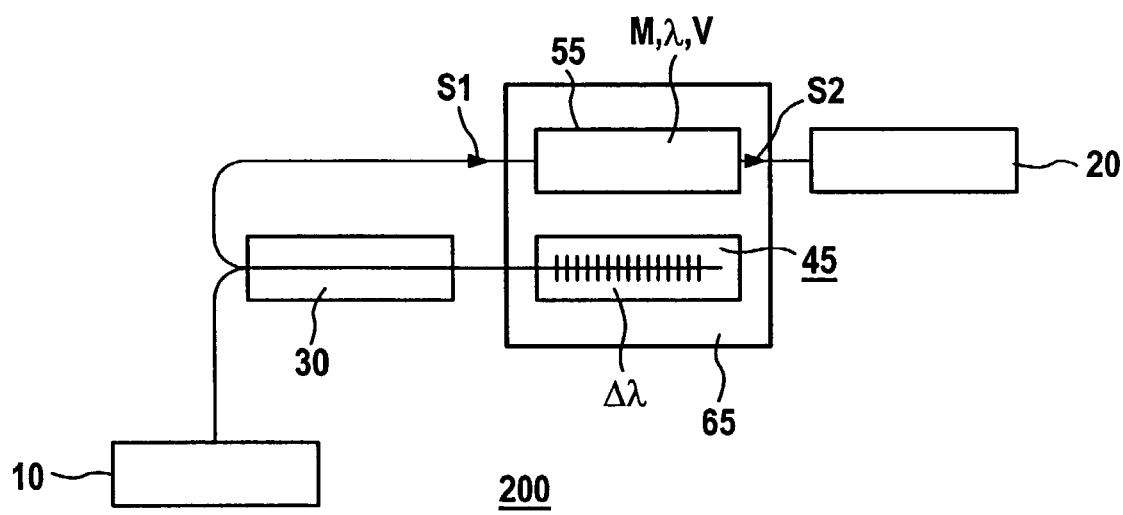

FIG. 2 illustrates another device 200 for the interfering-variable compensated optical acquisition of measured values, in which, as the interfering variable, it is not the ambient temperature T but a mechanical vibration V, to which another optical sensor 55 is subjected, which has to be compensated for. In a similar way to that in the case of the system 100 of FIG. 2, the optical sensor 55 together with a compensation element 45, which is again designed as a fiber Bragg grating, is located in a common interfering variable effect region 65. Once more, therefore, the sensor 55 and the compensation element 45 are subject to the same extent to the interfering variable, here the mechanical vibration V. In the case of the system 200, too, the compensation element 45 effects a wavelength change dependent on the interfering variable in the input optical signal S1.

Both in the case of the device 100 and in the case of the device 200, the light source 10 emits a wavelength spectrum with a spectral bandwidth which covers the entire wavelength range within which the wavelength change Δλ of the compensation element 40 or 45 under the influence of the interfering variable can take place. Depending on the embodiment of the fiber Bragg grating selected for the compensation element 40 or 45, the component of the input optical signal S1 reflected by the fiber Bragg grating can have a spectral width from a few 100 pm in the case of a uniform fiber Bragg grating up to several nanometers in the case of a chirped fiber Bragg grating.

The device 200 differs from the device 100 in the light path which the input optical signal S1 traces. Following production in the light source 10, the input optical signal S1 is this time firstly fed to the compensation element 45 via the fiber coupler 30. Here, the wavelength selective reflection occurs, inter alia also determined by the mechanical vibration V. The optical signal reflected in this way is then fed to the optical sensor 55 via the coupling element 30. After passing only once through the optical sensor 55 in this exemplary embodiment, the output optical signal S2 modified by the influence of the measured variable is fed to the receiver 20. Despite the differences in the light path guidance, the interfering variable compensation in the device 200 is carried out in an analogous way to the principle described in connection with the device 100. The same advantageous effects result.

Figure 3:
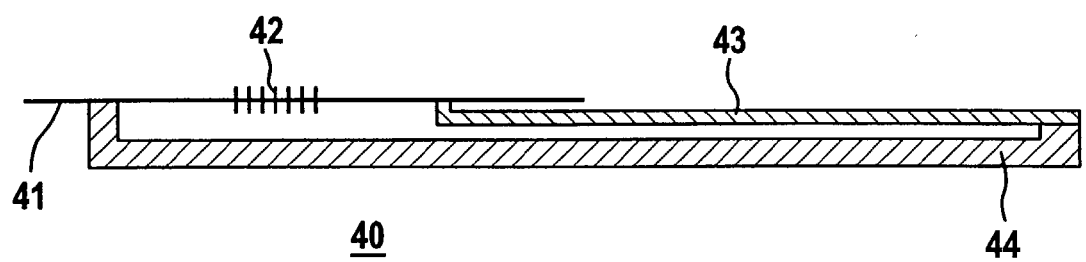
FIG. 3 shows a compensation element with housing for use in the devices according to FIG. 1 or 2 and FIG. 4 shows a compensation element with coating for use in the devices according to FIG. 1 or 2.
Figure 4:
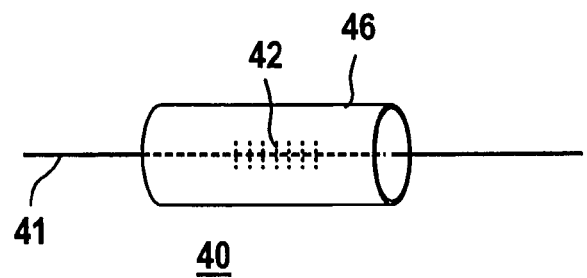

For the devices 100 and 200, in each case a compensation element 40 and 45 is needed which brings about, in a predefined manner, a wavelength change in the reflected optical signal which depends on the interfering variable. FIGS. 3 and 4 illustrate exemplary embodiments of such a compensation element 40, which has a construction modeled specifically in accordance with the desired temperature dependence. If required, the simulation of the desired temperature dependence can also be carried out section by section with linear approximations.

In the example of FIG. 3, at least part of an optical waveguide 41 in which a fiber Bragg grating 42 is arranged is accommodated in a housing. The optical waveguide 41 is arranged in the area of the fiber Bragg grating 42, between two housing parts 43 and 44. The two housing parts 43 and 44 exhibit a different thermal expansion. For example, the housing part 43 is produced from a material with a high thermal expansion and the housing part 44 from a material with a low thermal expansion. By selecting an appropriate material and also geometry for the housing parts 43 and 44, it is therefore possible to set a reflective behavior of the fiber Bragg grating 42 which depends on the temperature T. In particular, on the basis of the prestressing of the optical waveguide 41 between the housing parts 43 and 44, as provided in the exemplary embodiment of FIG. 3, it is also possible to provide a wavelength change which is negative in relation to the temperature change (=negative wavelength-temperature gradient).

Other possible housing shapes and arrangements for the action of force on a fiber Bragg grating are described in DE 199 39 583 A1. By using a housing, therefore, the natural thermal expansion of a fiber Bragg grating 42 arranged in an optical waveguide 41 can also be reinforced and also designed with a desired temperature dependence. A corresponding dependence on another interfering variable, for example the mechanical vibration V, may be implemented in a similar manner.

As shown in FIG. 4, the compensation element 40 having the fiber Bragg grating 42 arranged in the optical waveguide 41 can also have a coating 46 instead of a housing. The coating 46 is selected in such a way that the interfering variable effects a wavelength change $\Delta\lambda$ in the desired manner.

A combination of the two embodiments of FIGS. 3 and 4 is likewise possible. It is therefore also possible for a coated optical waveguide 41 and one arranged in a housing to be used.

By way of example, the design of the compensation element 40 for a magnetic-field or current-sensitive optical sensor 50 will be explained in the following text. The measured-variable sensitivity in this sensor type is determined by the Verdet constant, as it is known. The Verdet constant exhibits not only a dependence on the variable to be detected, the magnetic field here, but also a dependence on the interfering variable to be compensated for, the temperature here, and on the wavelength $\lambda$ of the optical signal S1 fed in.

In the temperature range in which the sensor 50 is used, the temperature dependence of the Verdet constant runs approximately between 0.01%/° C. and 0.02%/° C. In the temperature range of use considered here, a linear temperature dependence of the Verdet constant will be assumed between −40° C. and +80° C. Then, over the entire temperature range $\Delta T$ of 120° C., the measured result then exhibits a temperature-induced deviation of between ±0.6% and ±1.2%. This undesired influence is to be compensated for.

The wavelength dependence of the Verdet constant is, for example, −0.0003%/pm (see "Verdet Constant Dispersion in Annealed Optical Fiber Current Sensors" by A. H. Rose, et al., Journal of Lightwave Technology, vol. 15, No. 5, 1997, pages 803 to 807). In order to compensate for the determined, temperature-induced deviation of between ±0.6% and ±1.2%, the compensation element 40 should therefore exhibit a wavelength change dependent on the temperature of between 33 pm/° C. and 66 pm/° C. Over the entire temperature range $\Delta T$ of 120° C., there then results a wavelength change of between 4 nm and 8 nm, the fiber Bragg grating 42 used in the example considered here then having a main wavelength of about 850 nm.

The natural temperature dependence of the wavelength shift in the fiber Bragg grating 42 is of the order of magnitude of about 6.5 pm/° C., that is to say too low as compared with the value of between 33 pm/° C. and 66 pm/° C. needed for compensation. For this reason, the temperature dependence is increased by the use of an appropriate coating 46. For example, when use is made of the polymer described in "Enhanced pressure and temperature sensitivity of a fiber Bragg grating with polymer packaging" by Y. Liu et al., SPIE, vol. 3740, 1999, pages 284 to 287 as a material for the coating 46, at 50 pm/° C., a value is reached which lies precisely in the range between 33 pm/° C. and 66 pm/° C. needed here. Accordingly, by using a different coating material, it is also possible to achieve another required wavelength change in the compensation element 40 which is necessitated by the temperature or another interfering variable to be compensated for.

The invention has been described in detail with particular reference to preferred embodiments thereof and examples, but it will be understood that variations and modifications can be effected within the spirit and scope of the invention.

The invention claimed is:

1. A method of compensating for an interfering variable in an optical sensor, which produces a measurement of an intended variable using an optical signal, the measurement being influenced by a wavelength of the optical signal and by the interfering variable, the method comprising:
feeding the optical signal to a compensation element, which is located where the interfering variable is present, the optical signal being reflected in the compensation element to produce a reflected optical signal;
feeding the reflected optical signal to said optical sensor the optical sensor and the compensation element producing corresponding effects as a result of the interfering variable; and
allowing a wavelength change in the optical signal during reflection in the compensation element as a result of the interfering variable such that in the optical sensor where the interfering variable is present, the influences on the measurement by the wavelength change and by the interfering variable substantially cancel one another out.

2. The method as claimed in claim 1, wherein the compensation element is a Bragg grating.

3. The method as claimed in claim 1, wherein the interfering variable is temperature or vibration.

4. The method as claimed in claim 2, wherein the interfering variable is temperature or vibration.

5. A device for compensating for an interfering variable in an optical sensor, comprising:
a compensation element, in which an optical signal is reflected so that a reflected optical signal is produced, the reflected optical signal passing through said optical sensor, to produce a measurement of an intended variable, the measurement being influenced by a wavelength of the reflected optical signal and by the interfering variable;
both the optical sensor and the compensation element being located where the interfering variable is present, the compensation element producing a wavelength change as a result of the interfering variable, which wavelength change corresponds to the influence on the measurement in the optical sensor by the interfering variable such that in the optical sensor where the interfering variable is present the influence on the measurement by the wavelength change substantially cancels the influence on the measurement by the interfering variable.

6. The device as claimed in claim 5, wherein the compensation element is a Bragg grating.

7. The device as claimed in claim 5, wherein the interfering variable is temperature or vibration.

8. The device as claimed in claim 5, wherein the compensation element comprises a wavelength element and a housing, the housing having properties that change based on the interfering variable such that the housing and the wavelength element produce a predetermined wavelength change under the influence of the interfering variable.

9. The device as claimed in claim 5, wherein the compensation element comprises a coating surrounding a wavelength element.

10. A device according to claim 5, wherein the compensation element comprises;
   a Bragg grating having first and second ends;
   a first housing piece having a first coefficient of thermal expansion, the first housing piece supporting the first end of the Bragg grating; and
   a second housing piece fastened to the first housing piece, the second housing piece having a second coefficient of thermal expansion, different from the first coefficient of thermal expansion, the second housing piece supporting the second end of the Bragg grating.

11. The device as claimed in claim 6, wherein the interfering variable is temperature or vibration.

12. The device as claimed in claim 11, wherein the compensation element comprises a wavelength element and a housing, the housing having properties that change based on the interfering variable such that the housing and the wavelength element produce a predetermined wavelength change under the influence of the interfering variable.

13. The device as claimed in claim 12, wherein the compensation element comprises a coating surrounding a wavelength element.

14. A device according to claim 13, wherein the compensation element comprises;
   a Bragg grating having first and second ends;
   a first housing piece having a first coefficient of thermal expansion, the first housing piece supporting the first end of the Bragg grating; and
   a second housing piece fastened to the first housing piece, the second housing piece having a second coefficient of thermal expansion, different from the first coefficient of thermal expansion, the second housing piece supporting the second end of the Bragg grating.

* * * * *